(12) United States Patent  
Fukushima et al.

(10) Patent No.: US 9,296,083 B2  
(45) Date of Patent: Mar. 29, 2016

(54) POLISHING APPARATUS AND POLISHING METHOD (71) Applicant: Kabushiki Kaisha Toshiba, Minato-ku (JP)

(72) Inventors: Dai Fukushima, Kuwana (JP); Jun Takayasu, Yokkaichi (JP); Takashi Watanabe, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 139 days.

(21) Appl. No.: 14/109,011

(22) Filed: Dec. 17, 2013

(65) Prior Publication Data

US 2014/0342640 A1  Nov. 20, 2014

(30) Foreign Application Priority Data

May 15, 2013 (JP) .................. 2013-103036

(51) Int. Cl.
| | |
|---|---|
| B24B 49/16 | (2006.01) |
| B24B 49/08 | (2006.01) |
| B24B 37/005 | (2012.01) |
| B24B 37/30 | (2012.01) |
| B24B 37/04 | (2012.01) |
| H01L 21/67 | (2006.01) |
| B24B 49/10 | (2006.01) |
| H01L 21/02 | (2006.01) |

(52) U.S. Cl.
CPC ............. B24B 37/005 (2013.01); B24B 37/042 (2013.01); B24B 37/30 (2013.01); B24B 49/08 (2013.01); B24B 49/10 (2013.01); B24B 49/16 (2013.01); H01L 21/67219 (2013.01); H01L 21/02024 (2013.01)

(58) Field of Classification Search
CPC ........ B24B 49/00; B24B 49/08; B24B 49/16; B24B 3/005; B24B 3/10; B24B 3/30
USPC ............. 451/8, 10, 11, 41, 63, 285, 287, 288; 438/691, 692; 156/345.12, 345.13, 156/345.24
See application file for complete search history.

(56) References Cited

U.S. PATENT DOCUMENTS

| | | | | |
|---|---|---|---|---|
| 5,230,184 | A * | 7/1993 | Bukhman | B24B 37/11 451/41 |
| 5,486,129 | A * | 1/1996 | Sandhu | B23Q 15/013 451/10 |
| 5,762,539 | A * | 6/1998 | Nakashiba | B24B 49/16 451/285 |
| 5,868,896 | A * | 2/1999 | Robinson | B24B 37/013 156/701 |
| 5,888,120 | A * | 3/1999 | Doran | B24B 37/005 451/285 |

(Continued)

FOREIGN PATENT DOCUMENTS

| | | |
|---|---|---|
| JP | 7-130686 | 5/1995 |
| JP | 2005-123232 | 5/2005 |

(Continued)

*Primary Examiner* — Eileen Morgan  
(74) *Attorney, Agent, or Firm* — Oblon, McClelland, Maier & Neustadt, L.L.P (57) ABSTRACT

A polishing apparatus including a membrane including a pressure chamber and being configured to hold a wafer; a polishing portion including a polish pad contacting a polish surface of the wafer when polishing the wafer; a monitoring portion monitoring a state of inflation of the pressure chamber; and a controller controlling polishing of the wafer by the polishing portion based on a result of monitoring by the monitoring portion.

5 Claims, 9 Drawing Sheets

(56) References Cited

U.S. PATENT DOCUMENTS

| | | | | |
|---|---|---|---|---|
| 6,325,696 | B1* | 12/2001 | Boggs | B24B 37/30 451/11 |
| 6,390,905 | B1* | 5/2002 | Korovin | B24B 37/30 451/286 |
| 6,436,828 | B1* | 8/2002 | Chen | B24B 1/005 438/691 |
| 6,443,821 | B1* | 9/2002 | Kimura | B24B 37/30 348/231.6 |
| 6,659,850 | B2* | 12/2003 | Korovin | B24B 37/30 451/286 |
| 6,764,387 | B1* | 7/2004 | Chen | B24B 37/30 451/286 |
| 6,899,607 | B2* | 5/2005 | Brown | B24B 1/005 257/E21.23 |
| 7,040,955 | B1* | 5/2006 | Kalenian | B24B 49/16 451/41 |
| 7,059,937 | B2* | 6/2006 | Brown | B24B 1/005 451/288 |
| 7,131,891 | B2* | 11/2006 | Elledge | B24B 49/16 451/1 |
| 7,160,177 | B2* | 1/2007 | Herold | B24B 49/16 451/288 |
| 7,198,561 | B2* | 4/2007 | Chen | B24B 37/30 451/288 |
| 7,455,785 | B2* | 11/2008 | Koike | B24B 37/30 216/12 |
| 7,488,235 | B2* | 2/2009 | Park | B24B 1/005 451/10 |
| 7,935,216 | B2* | 5/2011 | Brown | B24B 1/005 156/345.12 |
| 8,070,560 | B2* | 12/2011 | Yasuda | B24B 37/30 451/286 |
| 8,268,115 | B2* | 9/2012 | Brown | B24B 1/005 156/345.13 |
| 8,845,394 | B2* | 9/2014 | Duescher | B24B 1/005 451/285 |
| 8,998,678 | B2* | 4/2015 | Duescher | B24B 37/32 451/28 |
| 2001/0007810 | A1 | 7/2001 | Moloney et al. | |
| 2005/0118937 | A1 | 6/2005 | Fukushima et al. | |
| 2006/0189259 | A1* | 8/2006 | Park | B24B 1/005 451/5 |
| 2012/0058709 | A1 | 3/2012 | Fukushima et al. | |
| 2012/0122373 | A1* | 5/2012 | Zhang | B24B 37/005 451/5 |

FOREIGN PATENT DOCUMENTS

| | | |
|---|---|---|
| JP | 2010-120160 | 6/2010 |
| JP | 2012-56011 | 3/2012 |
| JP | 2012-76157 | 4/2012 |

* cited by examiner

POLISHING APPARATUS AND POLISHING METHOD

CROSS-REFERENCE TO RELATED APPLICATION(S)

This application is based upon and claims the benefit of priority from Japanese Patent Application No. 2013-103036, filed on, May 15, 2013 the entire contents of which are incorporated herein by reference.

FIELD

Embodiments disclosed herein generally relate to a polishing apparatus and a polishing method.

BACKGROUND

As the structures of semiconductor devices become smaller, improvement in vertical precision is required in addition to lateral precision in controlling the scaling of the structures during the manufacturing process of the semiconductor devices. As the complexity of the manufacturing process flow increases in order to achieve microfabrication, steps formed on the surface of the semiconductor wafer tend to become larger. Further, increasing numbers of films are stacked one over the other in order to improve the vertical density of elements.

As a result, significantly high level of wafer planarity is required in semiconductor device manufacturing. In a polishing step, which is one process step in a semiconductor manufacturing process flow, CMP (Chemical Mechanical Polishing) may be employed for achieving planarity. However, the influence given by the condition of the components of CMP apparatus is becoming impermissible in achieving the required level of planarity.

DESCRIPTION

In one embodiment, a polishing apparatus is disclosed. The polishing apparatus includes a membrane including a pressure chamber and being configured to hold a wafer; a polishing portion including a polish pad contacting a polish surface of the wafer when polishing the wafer; a monitoring portion monitoring a state of inflation of the pressure chamber; and a controller controlling polishing of the wafer by the polishing portion based on a result of monitoring by the monitoring portion.

EMBODIMENTS

Embodiments are described hereinafter with references to the accompanying drawings. The drawings are not drawn to scale and thus, do not reflect the actual measurements of the features such as the correlation of thickness to planar dimensions and the relative thickness of different layers. Further, directional terms such as up, upper, upward, down, lower, downward, left, leftward, right, and rightward are used in a relative context with an assumption that the worked surface, on which circuitry is formed, of the later described semiconductor substrate faces up. Thus, the directional terms do not necessarily correspond to the directions based on gravitational acceleration.

First Embodiment

Figure 1:
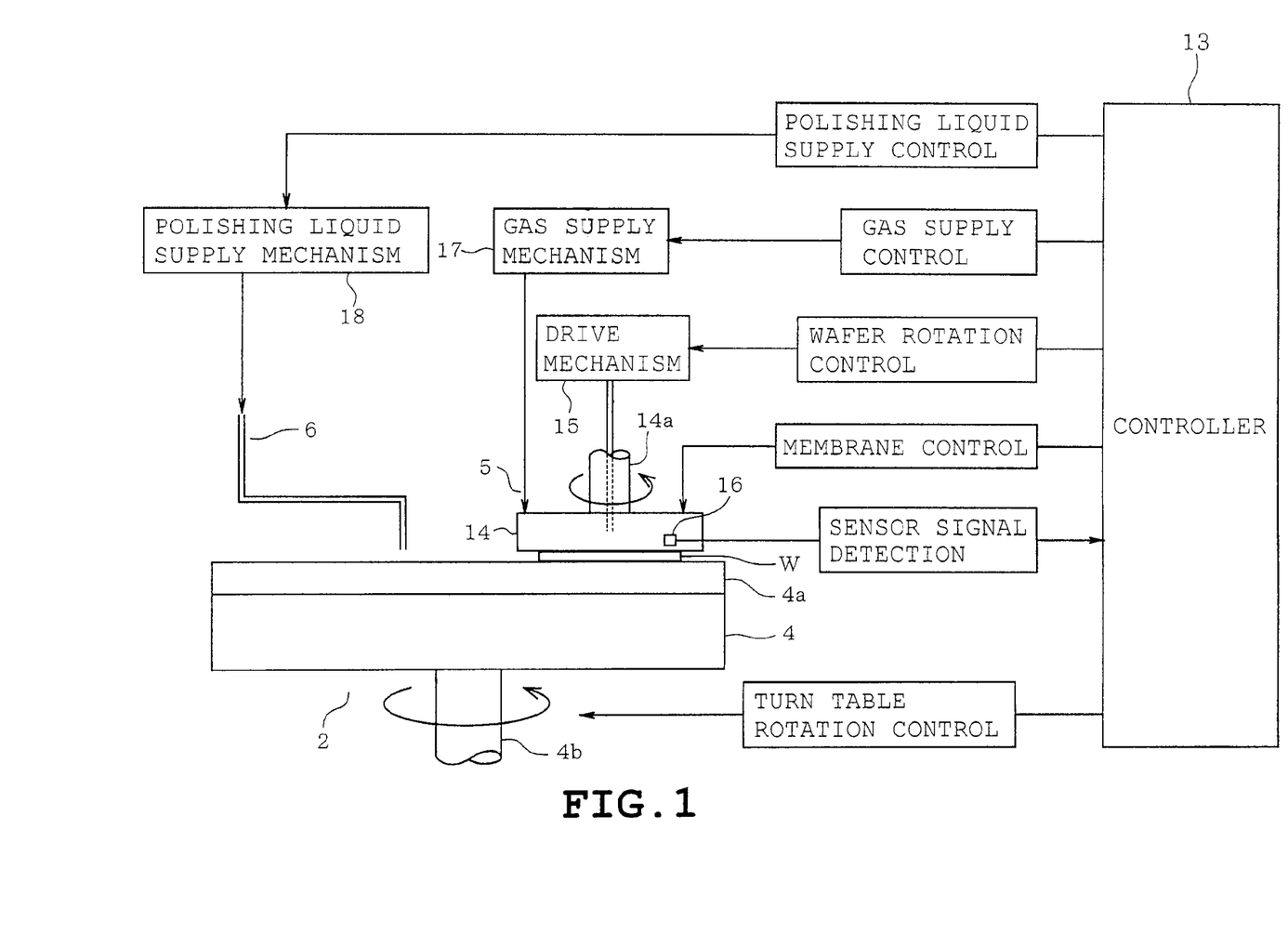
FIG. 1 illustrates one schematic example of a polishing apparatus of a first embodiment.
Figure 2:
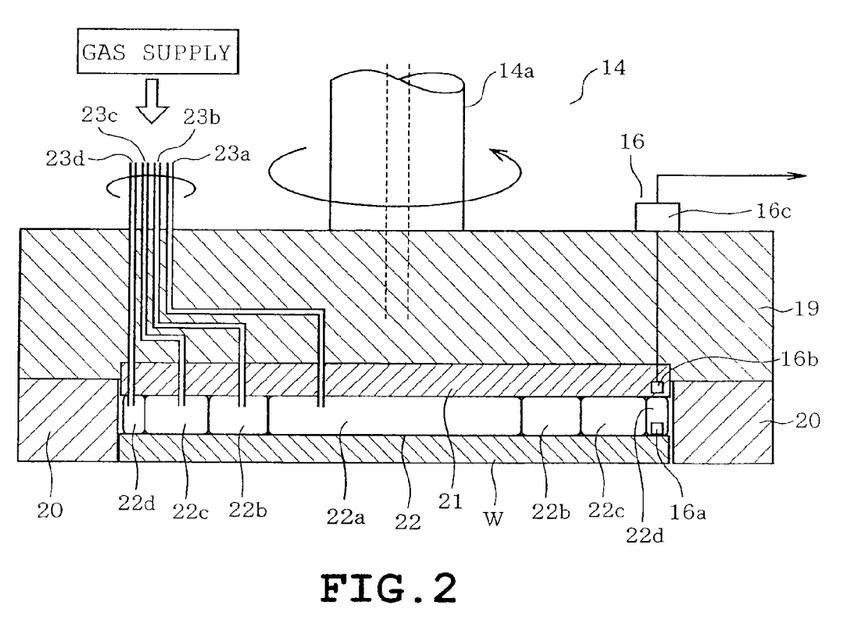
FIG. 2 is one schematic example of a vertical cross sectional view of a polish head.
Figure 3:
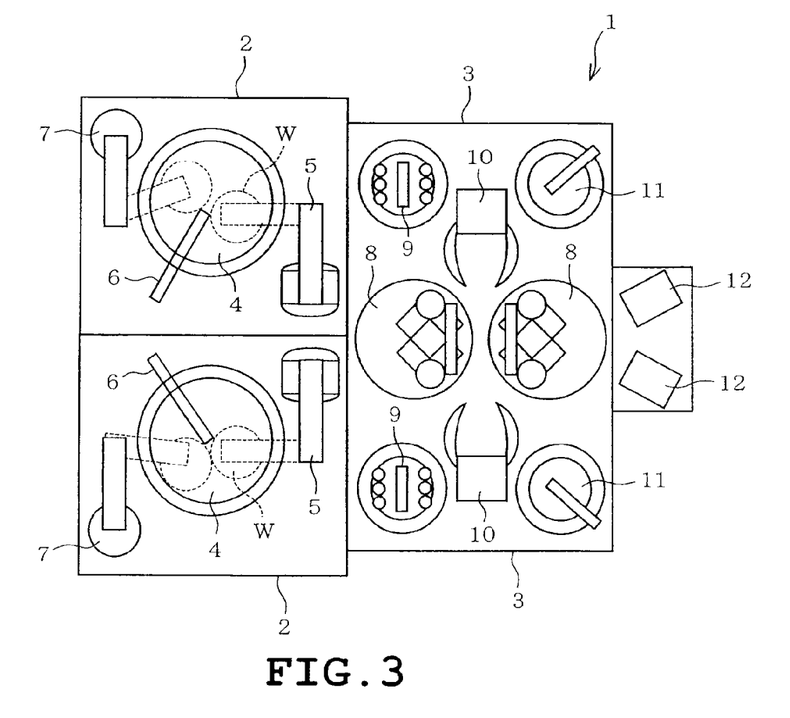
FIG. 3 is one schematic example of a plan view of the entire polishing apparatus.

FIGS. 1 to 7 illustrate a first embodiment. FIG. 3 illustrates the structures generally adopted in a CMP apparatus which is hereinafter referred to as CMP apparatus 1. CMP apparatus 1 includes, for example, a couple of polishing portions 2 and a couple of cleaning portions 3. Cleaning portion 3 cleans semiconductor wafers W transported from each of polishing portions 2. Polishing portion 2 includes turn table 4, polishing unit 5, polishing liquid dispenser nozzle 6 and dressing unit 7. Turn table 4 is driven in rotation by a motor provided in the lower portion of CMP apparatus 1. Polishing unit 5 receives the polish object, which is semiconductor wafer W in this example, and polishes semiconductor wafer W on turn table 4. Polishing liquid dispenser nozzle 6 dispenses drops of polishing liquid onto turntable 4. Dressing unit 7 dresses polish pad 4a provided at turn table 4 as shown in FIG. 1.

Cleaning portion 3 includes wafer carrier robot 8, two-sided roll cleaner 9, flipper 10, and pencil sponge cleaner 11. Wafer carrier robot 8 receives semiconductor wafer W from polishing unit 5 and carries it to two-sided cleaner 9. After both sides of semiconductor wafer W are washed with water, etc. by two-sided roll cleaner 9, semiconductor wafer W is carried to flipper 10 by wafer carrier robot 8. Wafer carrier robot 8 further carries semiconductor wafer W flipped over by flipper 10 to pencil sponge cleaner 11 where semiconductor wafer W is cleaned and dried and thereafter installed into wafer cassette 12.

FIG. 1 schematically illustrates the overall structure of polishing portion 2 of CMP apparatus 1. The drive of polishing portion 2 is controlled by controller 13. Controller 13 is primarily configured by a CPU and includes input/output interface and memory. Controller 13 controls the drive of each portions of polishing portion 2 with a later described polishing program.

Turn table 4 of polishing portion 2 is provided with polish pad 4a over its upper surface. Turn table 4 is driven in rotation by a motor via rotary shaft 4b extending downward from its bottom central portion. Polishing unit 5 is provided with polish head 14 which can be moved over turn table 4 by an arm, or the like, provided at polishing portion 2. Polish head 14 is driven in rotation with semiconductor wafer W attached to its under surface and executes the polishing process on turn table 4. Polish head 14 is provided with rotary shaft 14a which extends upward from its upper surface and which is connected to drive mechanism 15 provided with components such as a motor. The rotational drive of polish head 14 is controlled by controller 13.

Polish head 14 is provided with a wafer mount. The wafer mount is provided with detector 16 also referred to as a detecting portion and serving as a monitoring portion for detecting the state of polishing of semiconductor wafer W. Detector 16 may be provided at a single location or at multiple locations along the perimeter of pressure chamber 22d. Controller 13 controls polish head 14 in response to detection signals given by detector 16. A structure for adjusting the state of attachment of semiconductor wafer W is provided at the under surface of polish head 14. The structure is connected to gas supply mechanism 17 which, in this example, supplies air for enabling the adjustment of the state of attachment of semiconductor wafer W. Polishing liquid dispenser nozzle 6 dispenses polishing liquid onto the upper surface of turn table 4. The polishing liquid is supplied to polishing liquid dispenser nozzle 6 from polishing liquid supply mechanism 18.

FIG. 2 schematically illustrates a vertical cross section of polish head 14. Polish head 14 includes a disc-shaped body 19 having a recess on its under surface and retainer ring 20 provided along the outer peripheral portion of the under surface of body 19. The recess of body 19 accommodates chucking plate 21 which is movable up and down while holding semiconductor wafer W. On the under surface of chucking plate 21, membrane 22 is provided which contacts semiconductor wafer W.

Membrane 22 is provided with peripheral walls which are attached to the under surface of chucking plate 21. Thus, when assembled, membrane 22 and chucking plate 21 form four pressure chambers 22a to 22d. Pressure chambers 22a to 22d are formed concentrically around the center of the under surface of chucking plate 21. More specifically, a circular pressure chamber 22a is provided at the central portion of the under surface of chucking plate 21 and ring shaped pressure chambers 22b, 22c, and 22d are disposed in the outer periphery of pressure chamber 22a so as to be adjacent to one another. Air supply tubes 23a to 23d are provided to allow feeding of pressurized fluid, such as air, independently to each of pressure chambers 22a to 22d. The aforementioned gas supply mechanism 17 adjusts the pressure of pressure chambers 22a to 22d by supplying air into pressure chambers 22a to 22d through air supply tubes 23a to 23d in response to a gas supply signal given from controller 13.

Inside the outermost peripheral pressure chamber 22d, detection conductor 16a is provided so as to contact, for example, the inner bottom surface of membrane 22 as shown in FIG. 2. Detection conductor 16a along with detection coil 16b and detection circuit 16c is a component of detector 16. Detector 16 detects the elevation of semiconductor wafer W. The signal detected by detection coil 16b is amplified by detection circuit 16c and outputted to controller 13 as a detection signal. Detection conductor 16a is capable of detecting whether or not pressure chamber 22d is properly inflated with the supply of pressurized air. When pressure chamber 22d is not properly inflated, semiconductor wafer W is not maintained at the proper elevation and leads to uneven polishing. Detection coil 16b is disposed in the chucking plate 21 side so as to face detection conductor 16a.

Detector 16 operates as follows. A signal is conducted to detection coil 16b from detection circuit 16c. The signal is induced by excessive current flow produced based on the distance between detection conductor 16a and detection coil 16b and is transformed into a signal which varies depending upon the distance. The signal is amplified at detection circuit 16c and outputted as detection signal to controller 13.

As a result, it is possible for controller 13 to detect the location of detection conductor 16a disposed at the inner bottom portion of pressure chamber 22d and thereby evaluate the pressure applied to pressure chamber 22d, in other words, the state of inflation of pressure chamber 22d. Thus, it is possible for controller 13 to determine whether or not semiconductor wafer W is maintained at the appropriate elevation by pressure chamber 22d during the polishing process so as to contact polish pad 4a with appropriate pressure.

Next, a description will be given on the working of the above described structure with reference to FIGS. 4A to 7.

Figure 4A:
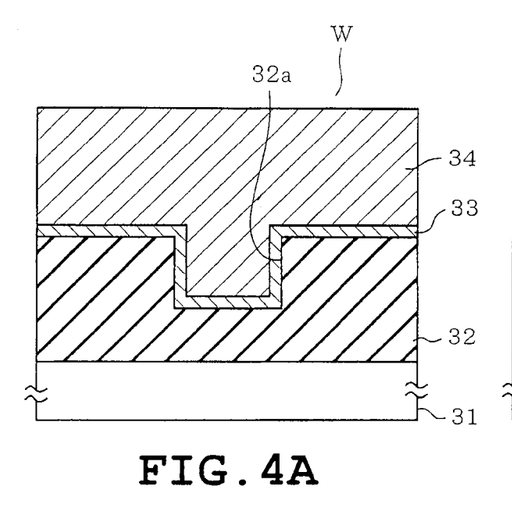
FIGS. 4A, 4B, 4C, and 4D are examples of cross sectional views illustrating a semiconductor device being polished by chemical mechanical polishing.

FIG. 4A illustrates the pre-polish state of semiconductor substrate 31 such as a semiconductor substrate. Though not shown, elements are formed on semiconductor substrate 31 through formation of diffusion regions and formation of various types of films and insulating film 32 is disposed above the elements. Insulating film 32 has trench 32a having a predetermined depth formed through it. Trench 32a is used as an interconnect. Barrier metal film 33 and metal film 34 are formed along the interior of trench 32a and along the upper surface of insulating film 32. Metal film 34 may be made of copper for example, and is used as an interconnect.

Figure 4B:
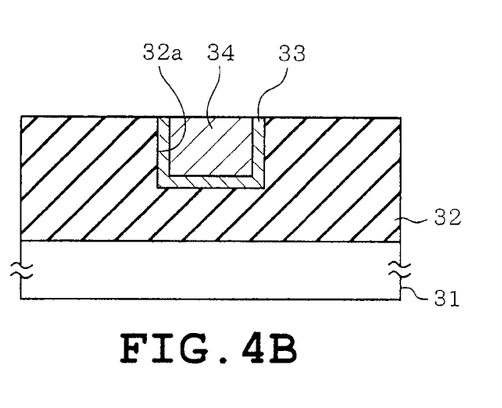

FIG. 4B illustrates the portions of metal film 34 and barrier metal film 33 overlying insulating film 32 polished by CMP apparatus 1. As shown, portions of metal film 34 and barrier metal film 33 inside trench 32a are not polished. Trench 32a is filled with metal film 34 via barrier metal film 33.

When proper polishing is performed, the state illustrated in the above described FIG. 4B results throughout the surface of semiconductor wafer W. However, when imbalance occurs in the inflation of pressure chambers 22a to 22d of membrane 22 to which semiconductor wafer W is attached, some portions of semiconductor wafer W may look like FIG. 4C or FIG. 4D after the polishing. Among pressure chambers 22a to 22d, the outermost peripheral pressure chamber 22d is highly susceptible to have varying inflation states. Even if the pressure applied by the supply of air into pressure chamber 22d through supply tube 23d meets the target conditions, it may result in insufficient or excessive inflation depending upon the condition of membrane 22.

Figure 4C:
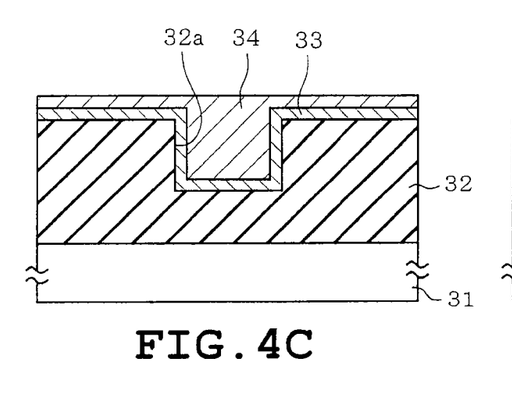

FIG. 4C illustrates semiconductor wafer W located immediately below pressure chamber 22d when the inflation of pressure chamber 22d is insufficient. Because the inflation of pressure chamber 22d is insufficient, the elevation of semiconductor wafer W is higher than in other portions. As a result, there is not enough contact between semiconductor wafer W and polish pad 4a. Because of insufficiency in the amount of polishing, barrier metal film 33 and metal film 34 remain over insulating film 32 as well.

Figure 4D:
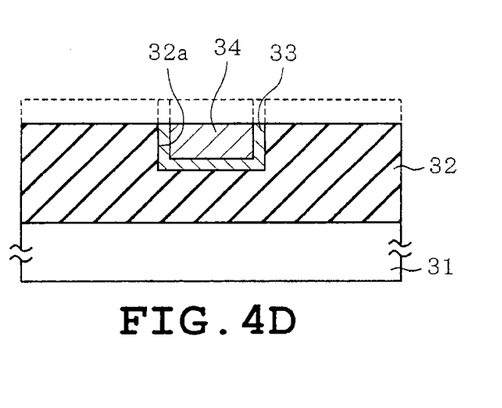

FIG. 4D illustrates the state of semiconductor wafer W located immediately below pressure chamber 22d when the inflation of pressure chamber 22d is excessive. Because the inflation of pressure chamber 22d is excessive, the elevation of semiconductor wafer W is lower than in other portions. As a result, there is excessive contact between semiconductor wafer W and polish pad 4a. Because the amount of polishing is excessive, insulating film 32 is polished which results in the shallowing of trench 32a and consequently insufficiency in the thickness of the embedded interconnect.

Figure 5A:
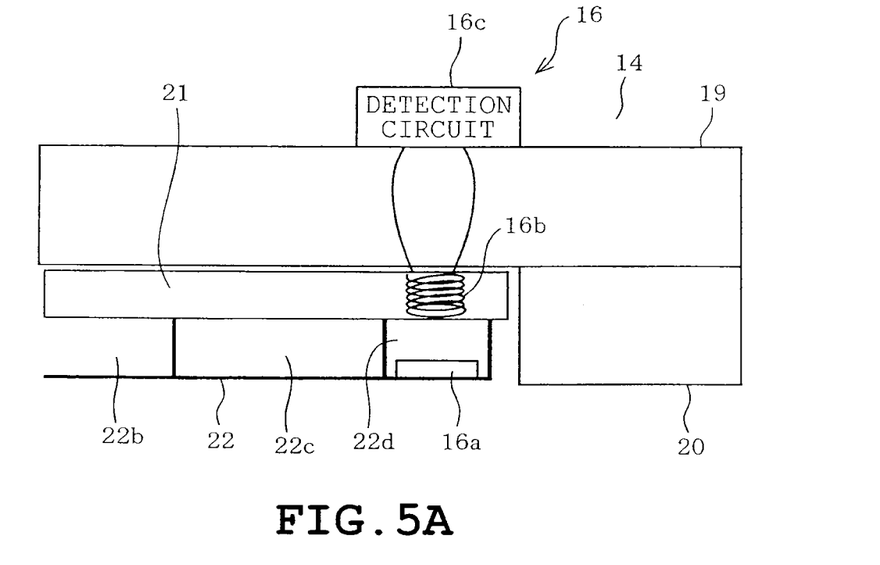
FIGS. 5A and 5B are examples of views describing the operation of a membrane monitoring process.
Figure 5B:
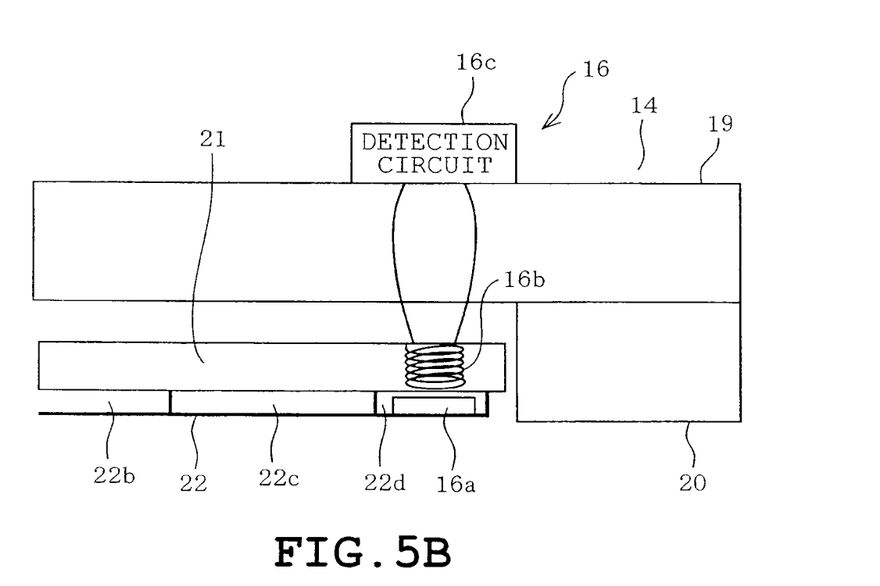

FIG. 5A illustrates the case in which the state of inflation of pressure chambers 22a to 22d of membrane 22 is good. FIG. 5B illustrates the case in which inflation of pressure chambers 22a to 22d is insufficient and chucking plate 21 is lowered. Detector 16 is capable of detecting the distance between detection conductor 16a and detection coil 16b based on a coil current detected by detection coil 16b from eddy current occurring at detection conductor 16a. Detection conductor 16a, being in close proximity of detection coil 16b as shown in FIG. 5B, can be detected by the increase in the detected current. The detected current is amplified into a detection signal by detection circuit 16c and transmitted to controller 13.

Thus, it is possible for controller 13 to detect the distance between the bottom surface of pressure chamber 22d and chucking plate 21 during the polishing process by the detection signal given by detection circuit 16c. As a result, it is possible for controller 13 to control the polishing process.

Figure 6:
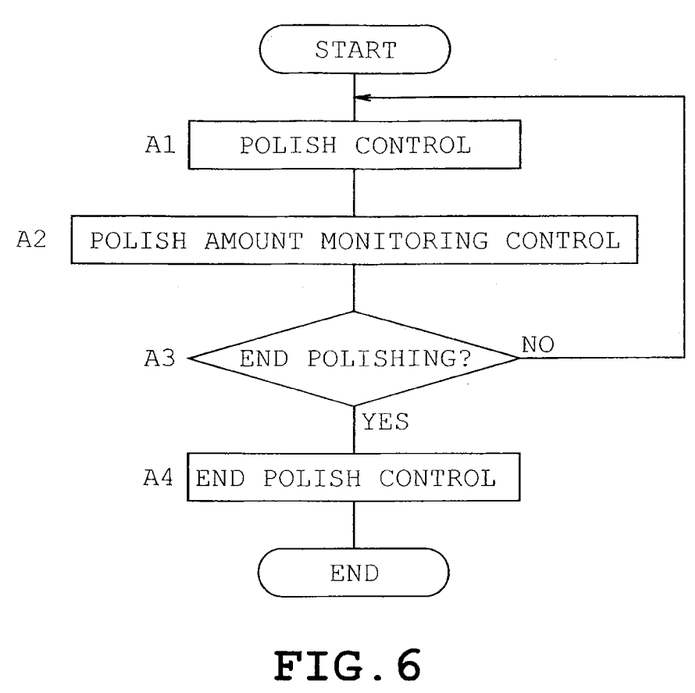
FIG. 6 is one example of a flowchart indicating the basic control flow of a polish process.

FIG. 6 schematically illustrates the general control flow of polishing process executed by controller 13. First, semiconductor wafer W is attached to polish head 14.

At step A1, controller 13 executes a polish control according to a preset polishing program. Controller 13 executes controls such as a rotation control of turn table 4, a wafer rotation control executed by drive mechanism 15 through polish head 14, polishing liquid supply control executed by polishing liquid supply mechanism 18 through dispenser nozzle 6, and gas supply control executed by gas supply mechanism 17 for supplying air to pressure chambers 22a to 22d.

At step A2, controller 13 monitors the amount of polishing during the execution of the polishing process. Monitoring of polish amount is an ordinary monitoring process executed by detecting torque variation, etc. during the rotation control of polish head 14. When the polish amount detected by the monitoring process is less than the predetermined polish amount (step A3: NO), the polish control and the monitoring process are repeated (A1, A2). Then, when the detected polish amount reaches the predetermined polish amount, a judgment is made to terminate the polishing process (step A3: YES) and the polishing process is terminated.

Figure 7:
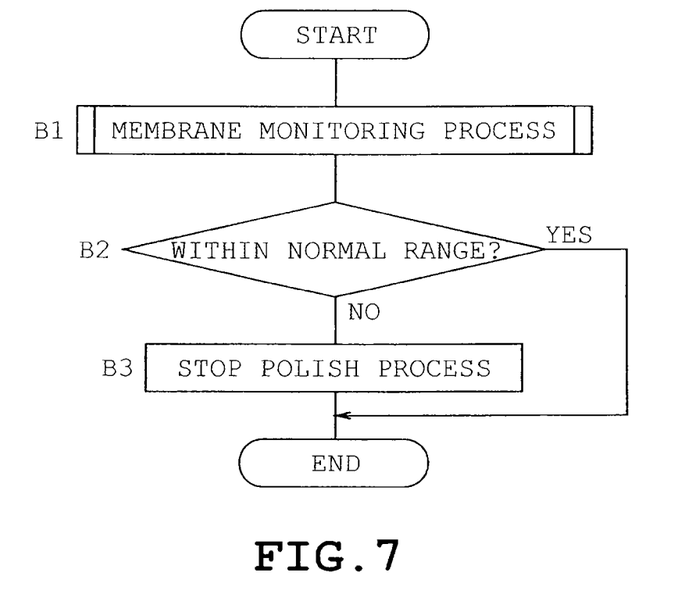
FIG. 7 is one example of a flowchart indicating the process flow of the membrane monitoring process.

While a normal polishing process is ongoing, controller 13 repeats the membrane monitoring process indicated in FIG. 7 at appropriate timings. At step B1, controller 13 executes a membrane monitoring process in which membrane 22 is monitored based on a detection signal produced by the aforementioned detector 16. The detection signal provides the detection of the distance between the bottom surface of pressure chamber 22d located at the outermost periphery of membrane 22 and chucking plate 21.

At step B2, controller 13 determines whether or not the height or the heightwise length of membrane 22 is within a normal range and if so (step B2: YES), the monitoring process is terminated and the polishing process is continued. When it is determined by controller 13 that the height of membrane 22 is not within the normal range (step B2: NO), a control is executed to stop the polishing process (B3). The membrane monitoring process is repeated while the polishing process is ongoing and a judgment is made each time to continue or terminate the polishing process.

In the first embodiment, it is possible to determine whether or not the inflation of pressure chamber 22d, located at the outermost periphery of polish head 14 during the polishing process, is within the normal range or in a normal state through detector 16 by executing membrane monitoring process program. Thus, it is possible to stop the polishing process when the result of membrane monitoring process by detector 16 is not within the normal range and also to restart the polishing process after adjusting the state of inflation of membrane 22 while the polishing process is stopped. Thus, when the result of the membrane monitoring process is not within the normal range, it is possible to prevent the polishing process to continue, which in turn prevents semiconductor wafer W from suffering irreparable damage.

Second Embodiment

Figure 8:
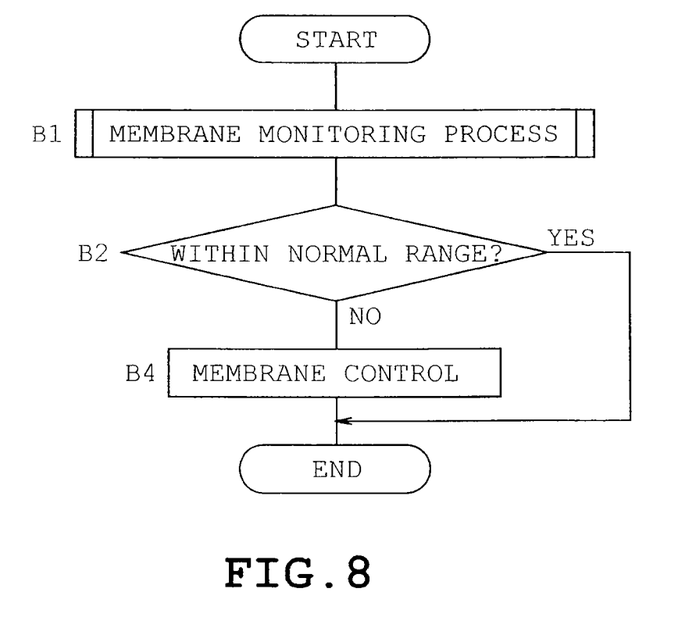
FIG. 8 is one example of a flowchart indicating the process flow of a membrane monitoring process of a second embodiment.

FIG. 8 illustrates a second embodiment. The second embodiment differs from the first embodiment in the control flow of the membrane monitor processing program. More specifically, in the first embodiment, controller 13 executes a control to stop the polishing process (B3) when the result of membrane monitoring process was not within the normal range. In contrast, in the second embodiment, controller 13 is capable of executing a control to improve the state of inflation of membrane 22 (B4) without stopping the polishing process.

For example, membrane 22 may be controlled so that when the height of membrane 22 is not within the normal range because the distance detected by detector 16 is too small due to insufficient inflation of pressure chamber 22d, controller 13 executes an gas supply control so that the inflation is increased by increasing the pressure applied to pressure chamber 22d from gas supply mechanism 17. When the height of membrane 22 is not within the normal range because the distance detected by detector 16 is too large due to excessive inflation of pressure chamber 22d, controller 13 executes a gas supply control so that inflation is reduced by reducing the pressure applied to pressure chamber 22d from gas supply mechanism 17.

As described above, controller 13 executes a pressure adjustment process to pressure chamber 22d (or other pressure chambers 22a to 22c) by using gas supply mechanism 17 when the result of membrane monitoring process is not within the predetermined range. As a result, the height of membrane 22 is controlled to fall within the normal range. Once the height of membrane 22 is varied to fall within the normal range, controller 13 may continue the polishing process.

When the height of membrane 22 does not fall within the normal range even after being subjected to the membrane control (B4) described above, controller 13 may stop the polishing process as was the case in the first embodiment. The polishing process may be arranged to be stopped when the height of membrane 22 does not fall within the normal range after executing the membrane control once or more than once.

In an alternative embodiment, controller 13 may be arranged to execute the membrane control so that the pressure of gas supplied to pressure chamber 22d by gas supply mechanism 17 may be temporarily increased so as to be greater than the target pressure to secure sufficient inflation and thereafter lowered to the target pressure. As a result of such control, it is possible to forcibly inflate pressure chamber 22d when insufficient inflation has been detected and to increase the possibility of controlling the state of inflation to the normal state during the polishing process.

Third Embodiment

Figure 9A:
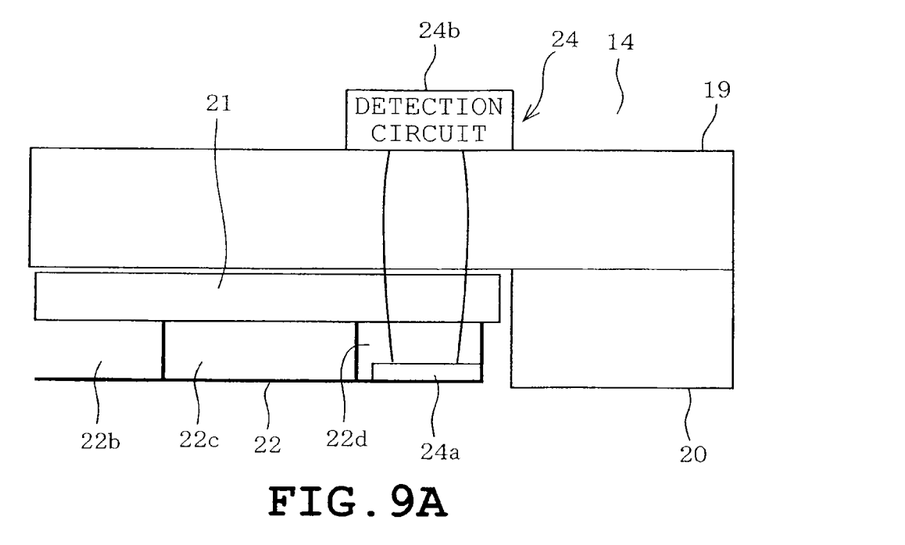
FIGS. 9A and 9B are examples of views describing the operation of a membrane monitoring process of a third embodiment.
Figure 9B:
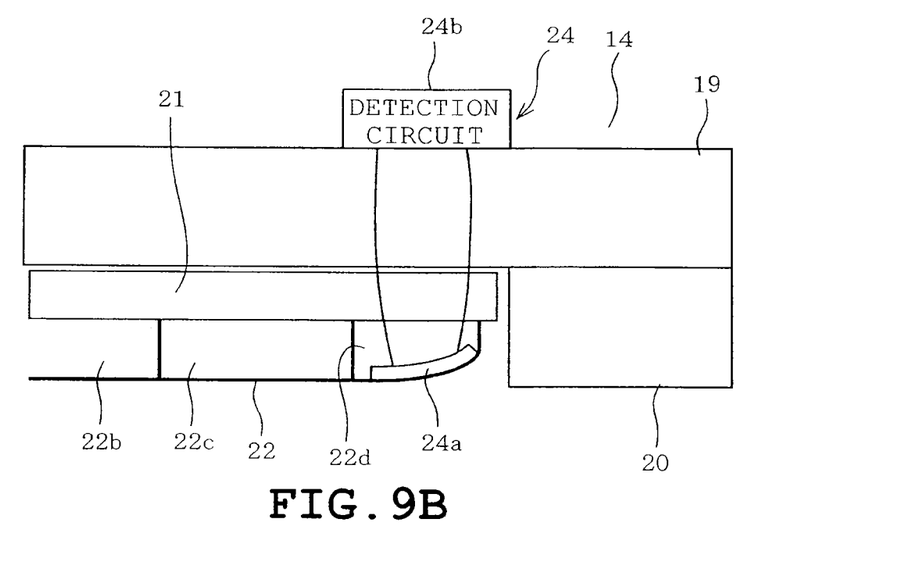

FIG. 9 illustrates a third embodiment. The third embodiment differs from the first or the second embodiment in that detector 16 is replaced by detector 24. Detector 24 includes sensor 24a comprising a piezoelectric element and detection circuit 24b for processing the detection signals. Sensor 24a is disposed at the inner bottom portion of pressure chamber 22d and outputs signals correlated with the state of inflation of membrane 22. For instance, sensor 24a may be formed into a sheet or mesh of piezoelectric film using the piezoelectric element and be attached to the inner bottom portion of pressure chamber 22d.

According to such structure, the piezoelectric element serving as sensor 24a stretches out when pressure chamber 22d is inflated sufficiently and bends when inflated insufficiently. Thus, sensor 24a, when given electric signals, is capable of outputting different signals depending upon the degree of the bend. As a result, it is possible for controller 13 to execute membrane monitoring process based on the detection signal given by detector 24. Controller 13 executes the polishing process and the membrane monitoring process in the manner already described.

The third embodiment obtains the operation and effect similar to those described in the first and the second embodiments. Sensor 24a comprising a piezoelectric element may alternatively comprise a strain sensor such as a strain gauge. In such case, the strain sensor bends when pressure chamber 22d is inflated insufficiently and outputs a sensor signal that differs from the sensor signal outputted when pressure chamber 22d is inflated normally. As a result, it is possible to obtain the operation and effect similar to those of the first and the second embodiments.

Fourth Embodiment

Figure 10A:
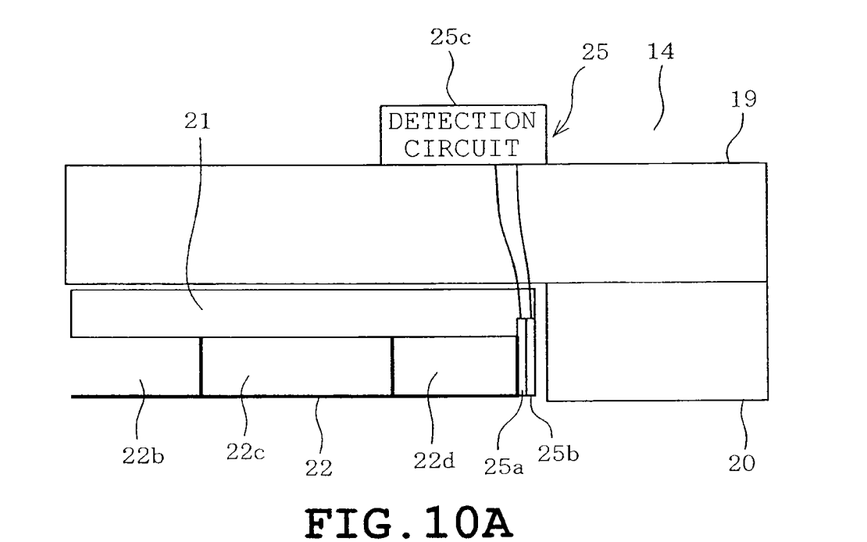
FIGS. 10A and 10B are examples of views describing the operation of a membrane monitoring process of a fourth embodiment.
Figure 10B:
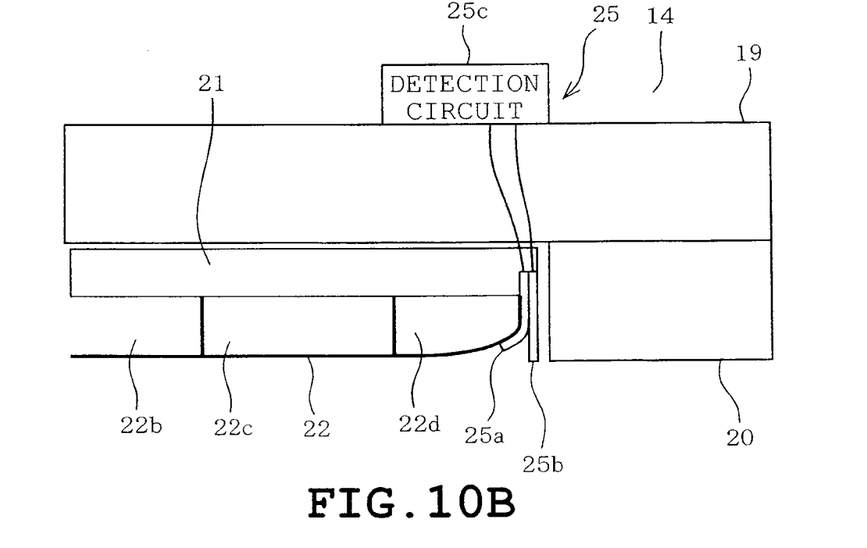

FIG. 10 illustrates a fourth embodiment. The fourth embodiment differs from the first or the second embodiment in that detector 16 is replaced by detector 25. Detector 25 includes contact members 25a and 25b and detection circuit 25c. The fourth embodiment utilizes the behavior in which the outer peripheral end surface of the outermost peripheral pressure chamber 22d is spaced from retainer ring 20 at a constant distance when pressure chamber 22d is normally inflated.

More specifically, in the fourth embodiment, a deformable contact member 25a is provided at the outermost peripheral surface of pressure chamber 22d so as to follow the shape of inflation of membrane 22. Contact member 25b is provided at the outer peripheral portion of chucking plate 21 so as to face contact member 25a. Contact member 25b provided in chucking plate 21 side is formed of a rigid material. Contact member 25b is disposed at a location facing contact member 25a so as to contact contact member 25a when pressure chamber 22d is normally inflated. A contact point is disposed on the lower end side of contact members 25a and 25b, respectively so that when the opposing contact members 25a and 25b contact one another, contact members 25a and 25b become electrically conductive. Both contact members 25a and 25b are connected to detection circuit 25c and the contact between contact members 25a and 25b is detected electrically.

By adopting the above described structure, it is possible to detect whether or not pressure chamber 22d is in a normally inflated state by determining whether or not contact members 25a and 25b of detector 25 are in contact with one another in the membrane monitoring process. Thus, it is possible to obtain the operation and effect similar to those of the first and the second embodiment.

In the fourth embodiment, the membrane monitoring process is executed by detecting the state of inflation of pressure chamber 22d through the detection of lateral distance by detector 25. The structure for detecting the lateral distance may comprise detector 16 of the first embodiment or a capacitance sensor, or other types of sensors that is capable of distance detection.

Detector 25 is provided at location(s) suitable for detecting the state of inflation of pressure chamber 22d. Detector 25 may be provided at a single location or multiple locations.

The fourth embodiment may be combined with the structures of the first, second, or the third embodiment, respectively.

Fifth Embodiment

Figure 11A:
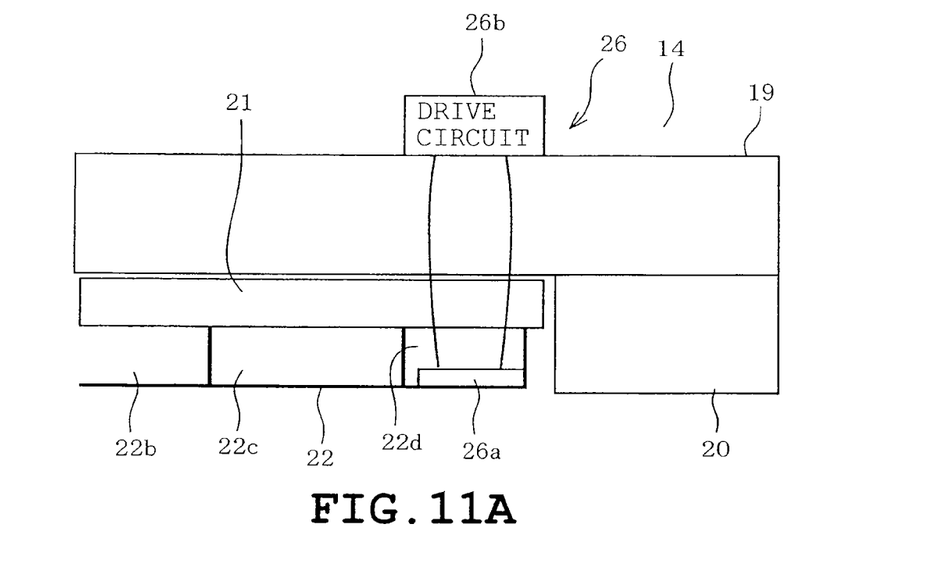
FIGS. 11A and 11B illustrate a fifth embodiment and are examples of views describing the bending and the stretching of the membrane.
Figure 11B:
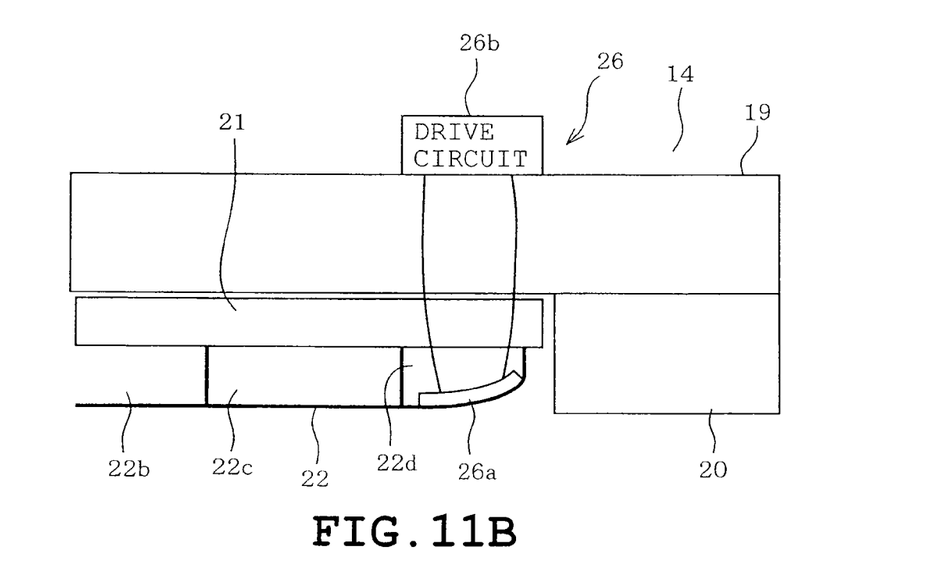

FIG. 11 illustrates a fifth embodiment. The fifth embodiment differs from the first embodiment in that detector 16 is replaced by drive portion 26. Drive portion 26 serves as a stress applying portion and comprises actuator 26a and drive circuit 26b. Actuator 26a is disposed, for example, along the inner bottom surface of pressure chamber 22d of membrane 22 and is driven by drive portion 26. Actuator 26a may, for example, be in the form of a sheet such as a piezoelectric film comprising a piezoelectric element. Thus, even when actuator 26a is bent to follow the shape of membrane 22, it is possible to stretch out actuator 26a through control executed by drive circuit 26b.

Thus, it is possible to stretch out actuator 26a by the control executed by controller 13 through drive circuit 26b even when pressure chamber 22d is not sufficiently inflated by the pressure applied by the air supplied to pressure chamber 22d by gas supply mechanism 17 serving as the pressure applying portion.

As a result, it is possible to normalize the inflation of the entire membrane 22 by stretching out pressure chamber 22d as much as a normally inflated state.

It is possible to keep pressure chamber 22d in a normally inflated state by controlling the drive of drive portion 26 by controller 13 when controlling the polishing process. Thus, it is possible to keep the normal inflation of pressure chamber 22d by the supply of gas from gas supply chamber 17.

Though a membrane monitoring process was not executed in the example discussed in the fifth embodiment, components such as detectors 16, 24, and 25 provided in the first to fourth embodiment may be employed so that the polishing process may be executed while performing a membrane monitoring process.

Other Embodiments

The above described embodiments may be modified as follows.

Each of the above described embodiments may be implemented alone or in combination.

Wafers other than semiconductor wafers may be polished.

In the above embodiments, pressurized fluid supplied to pressure chambers 22a to 22d from supply mechanism 17, serving as the pressure applying portion for inflating pressure chambers 22a to 22d, is air. However, other gases or liquids may be used in stead.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A polishing apparatus comprising:
a chucking plate;
a membrane provided along the undersurface of the chucking plate, the membrane including a pressure chamber and being configured to hold a wafer;
a polishing portion including a polish pad contacting a polish surface of the wafer when polishing the wafer;
a monitoring portion monitoring a state of inflation of the pressure chamber; and
a controller controlling polishing of the wafer by the polishing portion based on a result of monitoring by the monitoring portion,
wherein the monitoring portion includes a first detecting portion detecting the state of inflation of the pressure chamber by detecting a distance between the chucking plate and an inner bottom portion of the pressure chamber, the distance being taken along a direction of height.

2. The apparatus according to claim 1, wherein the first detecting portion includes a coil and a detection conductor either of which being provided at an upper surface side of the pressure chamber and the remaining other of which being provided at a lower surface side of the pressure chamber so as to oppose one other, and wherein the distance is detected by detecting impedance of the coil which varies with variation of distance between the coil and the detection conductor.

3. The apparatus according to claim 1, further comprising a retainer ring disposed around the pressure chamber, wherein the monitoring portion includes a third detecting portion detecting the state of inflation of the pressure chamber by detecting a distance between an outermost peripheral surface of the pressure chamber and the retainer ring.

4. The apparatus according to claim 3, wherein the third detecting portion comprises a first contact member disposed at the membrane and a second contact member disposed at the retainer ring so as to face one another, the third detecting portion detecting the state of inflation of the pressure chamber by detecting contact between the first and the second contact member in which state the first and the second contact member are electrically conductive.

5. The apparatus according to claim 3, wherein the third detecting portion detects the state of inflation of the pressure chamber by detecting a distance between given multiple locations on the outermost peripheral surface of the pressure chamber and the retainer ring.

* * * * *